US011109513B2

(12) United States Patent
Kawamura et al.

(10) Patent No.: US 11,109,513 B2
(45) Date of Patent: Aug. 31, 2021

(54) HEAT CONDUCTIVE SHEET AND MULTILAYERED HEAT CONDUCTIVE SHEET

(71) Applicant: Panasonic Intellectual Property Management Co., Ltd., Osaka (JP)

(72) Inventors: Norihiro Kawamura, Hokkaido (JP); Daishi Takahashi, Hokkaido (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 16/478,156

(22) PCT Filed: Jan. 12, 2018

(86) PCT No.: PCT/JP2018/000613
§ 371 (c)(1),
(2) Date: Jul. 16, 2019

(87) PCT Pub. No.: WO2018/142879
PCT Pub. Date: Aug. 9, 2018

(65) Prior Publication Data
US 2019/0373775 A1  Dec. 5, 2019

(30) Foreign Application Priority Data

Feb. 6, 2017  (JP) .............................. JP2017-019180
Jun. 2, 2017  (JP) .............................. JP2017-109737

(51) Int. Cl.
*H05K 7/20* (2006.01)
*B32B 1/04* (2006.01)
(Continued)

(52) U.S. Cl.
CPC ........... *H05K 7/20481* (2013.01); *B32B 1/04* (2013.01); *B32B 3/26* (2013.01); *B32B 7/02* (2013.01);
(Continued)

(58) Field of Classification Search
CPC ........ H05K 7/20481; B32B 1/04; B32B 3/26; B32B 7/02; B32B 7/12; B32B 9/045;
(Continued)

(56) References Cited

U.S. PATENT DOCUMENTS 6,257,328 B1 * 7/2001 Fujiwara ................. F28F 13/00
                                                    165/185
2005/0180113 A1 * 8/2005 Shirakami ........... F28D 15/0233
                                                    361/704
2017/0368795 A1 * 12/2017 Kutsumizu ............. C01B 32/20

FOREIGN PATENT DOCUMENTS

JP      2012-160503          8/2012
WO      1999/019908          4/1999
WO      WO-2016104759 A1 *   6/2016  ............. B32B 9/045

OTHER PUBLICATIONS

International Search Report of PCT application No. PCT/JP2018/000613 dated Mar. 20, 2018.

* cited by examiner

*Primary Examiner* — David Sample
*Assistant Examiner* — Donald M Flores, Jr.
(74) *Attorney, Agent, or Firm* — McDermott Will & Emery LLP

(57) ABSTRACT

The present disclosure relates to a heat conductive sheet that includes a heat generation component having a large heat generation amount. The heat conductive sheet according to the present disclosure includes a heat radiation sheet having a graphite sheet, a first protective film provided on one surface side of the graphite sheet, and a second protective
(Continued)

film provided on another surface side of the graphite sheet. The heat radiation sheet includes a bent part that is bent, and a first heat radiation part and a second heat radiation part that are coupled to each other through the bent part and overlapping with each other in a view from above. Further, a first non-adhesive area in which the first heat radiation part and the second heat radiation part are not adhered to each other is provided between the first heat radiation part and the second heat radiation part.

4 Claims, 5 Drawing Sheets

(51) Int. Cl.
*B32B 3/26* (2006.01)
*B32B 7/02* (2019.01)
*H01L 23/373* (2006.01)
*F28F 21/02* (2006.01)

(52) U.S. Cl.
CPC ............ *F28F 21/02* (2013.01); *H01L 23/373* (2013.01); *Y10T 428/2419* (2015.01); *Y10T 428/24198* (2015.01)

(58) Field of Classification Search
CPC ......... B32B 3/04; B32B 9/007; B32B 27/281; B32B 2250/40; B32B 2457/00; B32B 2307/732; B32B 18/00; F28F 21/02; H01L 23/373; Y10T 428/24198; Y10T 428/2419
See application file for complete search history.

HEAT CONDUCTIVE SHEET AND MULTILAYERED HEAT CONDUCTIVE SHEET

CROSS-REFERENCE TO RELATED APPLICATIONS

This application is a U.S. national stage application of the PCT International Application No. PCT/JP2018/000613 filed on Jan. 12, 2018, which claims the benefit of foreign priority of Japanese patent application 2017-019180 filed on Feb. 6, 2017 and Japanese patent application 2017-109737 filed on Jun. 2, 2017, respectively, the contents all of which are incorporated herein by reference.

FIELD OF THE INVENTION

The present disclosure relates to a heat conductive sheet that radiates heat generated from a heat generation component and to a multilayered heat conductive sheet.

DESCRIPTION OF THE RELATED ART

In recent years, a heat generation amount of a heat generation component mounted on various electronic devices has been increasing. Due to an influence of the heat generation, there is an increasing possibility that the electronic devices may experience troubles in operation.

As a heat conductive sheet that radiates heat generated from the heat generation component, PTL 1 is cited.

CITATION LIST

Patent Literature

PTL 1: Unexamined Japanese Patent Publication No. 2012-160503

SUMMARY OF THE INVENTION

A composite film as described in PTL 1 has improved heat radiation property by laminating a plurality of graphite sheet layers. However, heat is not easily conducted by simply laminating the plurality of graphite sheet layers, because a layer and a space are present between the graphite sheet layers, and therefore, the heat radiation property is low.

Moreover, bendability of the composite film is not described.

A heat conductive sheet according to the present disclosure includes a heat radiation sheet having a graphite sheet, a first protective film provided on one surface side of the graphite sheet, and a second protective film provided on another surface side of the graphite sheet. The heat radiation sheet includes a bent part that is bent, and a first heat radiation part and a second heat radiation part coupled to each other through the bent part and overlapping with each other in a perpendicular direction to a principal surface of the graphite sheet. Between the first heat radiation part and the second heat radiation part, there is provided a first non-adhesive area in which the first heat radiation part and the second heat radiation part are not adhered to each other.

The heat conductive sheet of the present disclosure has high bendability with the above configuration, and because heat conducted to the first heat radiation part is conducted to the second heat radiation part through the bent part, the heat conductive sheet can achieve high heat radiation property.

DETAILED DESCRIPTION OF THE PREFERRED EMBODIMENTS

Each of the exemplary embodiments described below shows one specific example. Numeric values, shapes, materials, constituents, arrangement positions and connection modes of the constituents, and the like, which are shown in the following exemplary embodiments, are merely examples, and are not intended to limit the present invention. Further, among the constituents in the following exemplary embodiments, constituents which are not recited in the independent claim representing the most generic concept are described as arbitrary constituents. Note that in the following, the same or corresponding elements are assigned with the same symbols, and the overlapping description is omitted.

Conventionally, a heat conductive sheet formed by laminating a plurality of graphite sheets has been discussed to achieve high heat radiation property.

In addition, in recent years, a heat conductive sheet having high bendability has been desired. Such a heat conductive sheet has a possibility of being useful in, for example, an electronic device provided with a folding function such as a laptop computer, a smart phone having a next generation bendable display, and the like.

However, the above-described heat conductive sheet having high bendability cannot be achieved by simply laminating the graphite sheets in order to achieve high heat radiation property.

Hereinafter, high bendability refers to an action effect in which destruction caused by bending or peeling between different materials hardly occurs.

<About Heat Conductive Sheet>

First Exemplary Embodiment

Figure 1:
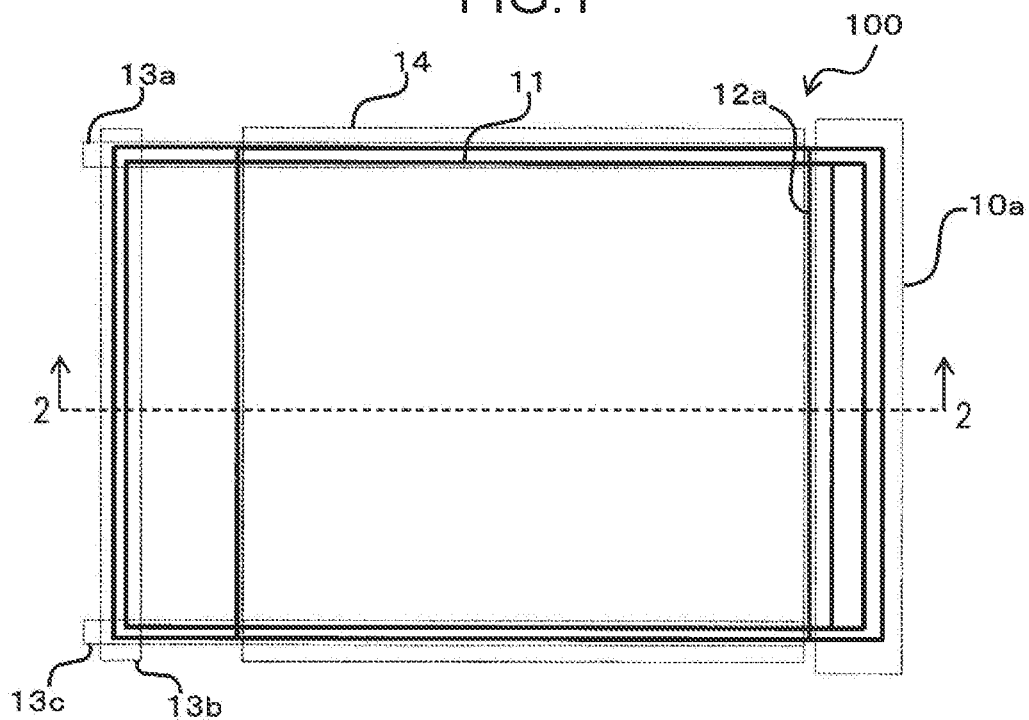
FIG. 1 is a top view of a heat conductive sheet according to a first exemplary embodiment of the present disclosure.

FIG. 1 is a top view of a heat conductive sheet according to a first exemplary embodiment of the present disclosure.

Figure 2:
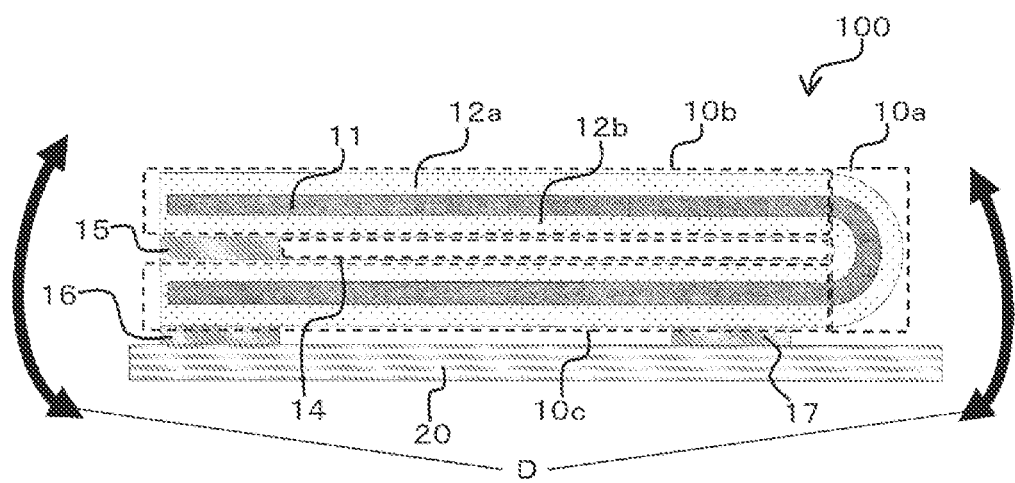
FIG. 2 is a cross-sectional view of the heat conductive sheet in FIG. 1, cutting along a line 2-2.

FIG. 2 is a cross-sectional view of heat conductive sheet 100 in FIG. 1, cutting along a line 2-2.

Heat conductive sheet 100 includes heat radiation sheet 30 having graphite sheet 11, protective film 12a provided on one surface side of graphite sheet 11, and protective film 12b provided on another surface side opposite to the one surface side. Heat radiation sheet 30 includes heat radiation part 10b and heat radiation part 10c that are bent at bent part 10a and overlap with each other. Each of bent part 10a, heat radiation part 10b, and heat radiation part 10c has graphite sheet 11, protective film 12a, and protective film 12b. Protective film 12a is bent inward by bent part 10a, and protective film 12b is bent outward by bent part 10a.

A shape of heat conductive sheet 100 is maintained by heat radiation part 10b and heat radiation part 10c being adhered by adhesive layer 15.

Heat radiation part 10b and heat radiation part 10c are coupled through bent part 10a.

Heat conductive sheet 100 includes, in a view from above, adhesive layer 16 overlapping adhesive layer 15, and adhesive layer 17 on the same plane as adhesive layer 16. Heat conductive sheet 100 is pasted to substrate 20 by adhesive layer 16 and adhesive layer 17. With this configuration, heat conductive sheet 100 can achieve high heat radiation property because heat is conducted through bent part 10a, for example, from heat radiation part 10b to heat radiation part 10c. On the other hand, a heat conductive sheet disclosed in PTL 1 has a configuration in which a plurality of graphite sheets are simply laminated and a bent part is not provided, and accordingly, has low heat radiation property.

Here, the view from above refers to a view seen from a direction above heat radiation part 10b and perpendicular to a principal surface of heat radiation part 10b. For example, in FIG. 2, the view from above is a view seen from a side of heat radiation part 10b and from an opposite side of heat radiation part 10c.

Further, heat conductive sheet 100 has non-adhesive area 14 between heat radiation part 10b and heat radiation part 10c, where heat radiation part 10b and heat radiation part 10c are not adhered to each other. Note that heat radiation part 10b and heat radiation part 10c are not adhered to each other refers to a configuration in which a space exists between heat radiation part 10b and heat radiation part 10c, or to a configuration in which heat radiation part 10b and heat radiation part 10c are brought into contact with each other. Non-adhesive area 14 is provided, in the view from above, between bent part 10a and adhesive layer 16.

With this configuration, heat conductive sheet 100 of the present disclosure can achieve high bendability without causing destruction of heat conductive sheet 100 or peeling between each of the different materials, even if heat conductive sheet 100 is bent at the same time with substrate 20.

Heat conductive sheet 100 has an overlapping end part where an outer peripheral end part of heat radiation part 10b and an outer peripheral end part of heat radiation part 10c overlap with each other in the view from above. This overlapping end part has overlapping end part 13a connected with bent part 10a, overlapping end part 13b connected with overlapping end part 13a, and overlapping end part 13c connected to overlapping end part 13b and bent part 10a respectively. In the view from above, overlapping end part 13b overlaps with adhesive layer 15 and adhesive layer 16. Further, a part of non-adhesive area 14 overlaps with, in the view from above, overlapping end part 13a and overlapping end part 13c respectively.

Still further, it is preferable that adhesive layer 17 has a configuration of being provided, in the view from above, between a part of non-adhesive area 14 and bent part 10a. With this configuration, even if heat conductive sheet 100 is bent in a direction D, bent part 10a is pulled in response to reduce stress applied to each member of heat conductive sheet 100, and accordingly, high bendability can be achieved.

Moreover, an area of protective film 12b is preferably smaller than an area of protective film 12a. In other words, by reducing the area of protective film 12b provided on an inner side of the heat conductive sheet than protective film 12a, a configuration is made in which protective film 12a and protective film 12b are aligned at an end part of heat conductive sheet 100 opposite to bent part 10a.

Graphite sheet 11 and protective film 12a are adhered to each other using, for example, a double-sided tape having adhesive material on both surfaces of a base material. Graphite sheet 11 and protective film 12b are also adhered to each other using the similar double-sided tape. Regarding the double-sided tape, the base material is formed of, for example, polyethylene terephthalate (hereinafter, referred to as PET), and the adhesive material is formed of acrylic-based adhesive material. A thickness of the double-sided tape is, for example, 6 μm. In this case, a thickness of the base material is 2 μm, and a thickness of each layer of the adhesive material is 2 μm.

Material of protective film 12a and protective film 12b is preferably polyimide. Polyimide has high bendability and high heat resistance as compared to PET. A thickness of protective film 12a and protective film 12b is, for example, 10 μm.

Graphite sheet 11 is formed of, for example, a pyrolyzed graphite sheet, and has a thickness of 25 μm. The pyrolyzed graphite sheet formed by thermally decomposing high polymers has anisotropy in a direction of heat conduction, and a coefficient of heat conductivity in a plane direction is higher than a coefficient of heat conductivity in a thickness direction. The coefficient of heat conductivity in the plane direction in graphite sheet 11 is 1600 W/mK.

<About Multilayered Heat Conductive Sheet>

By laminating a large number of heat conductive sheets 100, higher heat radiation property can be achieved. However, when a large number of heat conductive sheets 100 are laminated, stress applied at a time of bending increases, causing destruction or peeling between different materials and accordingly, bendability is reduced.

Second Exemplary Embodiment

Figure 3:
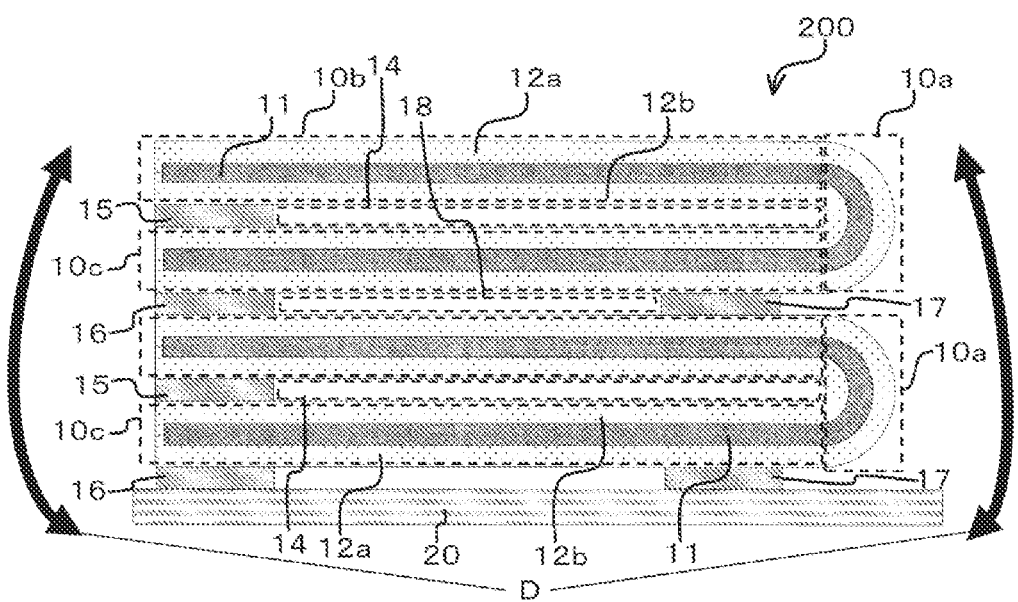
FIG. 3 is a cross-sectional view of a multilayered heat conductive sheet according to a second exemplary embodiment of the present disclosure.

FIG. 3 is a cross-sectional view of a multilayered heat conductive sheet according to a second exemplary embodiment of the present disclosure. A top view of the multilayered heat conductive sheet is the same as in FIG. 1.

Multilayered heat conductive sheet 200 has a configuration in which two heat conductive sheets 100 are laminated. With this configuration, multilayered heat conductive sheet 200 can achieve even higher heat radiation property than one heat conductive sheet 100. Note that multilayered heat conductive sheet 200 of the present disclosure is described to have a configuration in which two heat conductive sheets 100 are laminated, however, a number of sheets that heat conductive sheets 100 are laminated is not particularly limited.

Multilayered heat conductive sheet 200 has a configuration in which two bent parts 10a overlap with each other in a view from above. Two heat conductive sheets 100 are adhered by adhesive layer 16 and adhesive layer 17 on one of heat conductive sheets 100.

Here, the view from above refers to a view seen from a direction above heat radiation part 10*b* and perpendicular to a principal surface of heat radiation part 10*b*. For example, in FIG. 3, the view from above is a view seen from a side of heat radiation part 10*b* and from an opposite side of heat radiation part 10*c*.

Non-adhesive area 18 is provided between two heat conductive sheets 100 where two heat conductive sheets 100 are not adhered to each other. Non-adhesive area 18 is provided between adhesive layer 16 and adhesive layer 17 in the view from above. Further, a part of non-adhesive area 18 overlaps with overlapping end part 13*a* and overlapping end part 13*c* respectively, and is exposed at an end part of multilayered heat conductive sheet 200. Still further, non-adhesive area 18 and two non-adhesive areas 14 overlap with each other.

With this configuration, multilayered heat conductive sheet 200 can achieve high heat radiation property and high bendability.

Third Exemplary Embodiment

Figure 4:
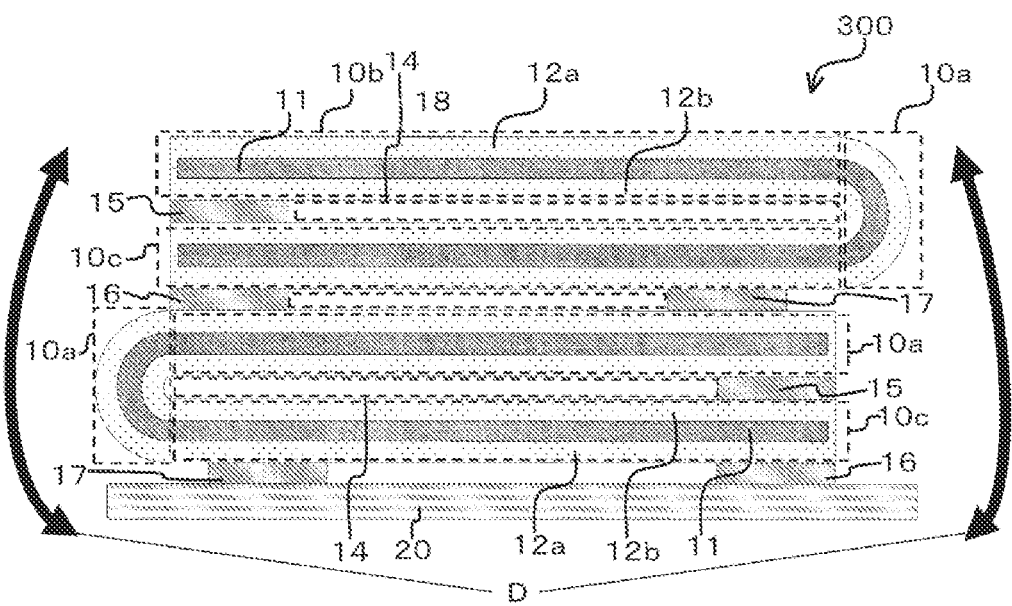
FIG. 4 is a cross-sectional view of a multilayered heat conductive sheet according to a third exemplary embodiment of the present disclosure.

FIG. 4 is a cross-sectional view of a multilayered heat conductive sheet according to a third exemplary embodiment of the present disclosure. A top view of the multilayered heat conductive sheet is the same as in FIG. 1.

Multilayered heat conductive sheet 300 has a configuration in which two heat conductive sheets 100 are laminated. By laminating two heat conductive sheets 100, still higher heat radiation property can be achieved. Note that multilayered heat conductive sheet 300 of the present disclosure is described to have a configuration in which two heat conductive sheets 100 are laminated, however, a number of sheets that heat conductive sheets 100 are laminated is not particularly limited.

Multilayered heat conductive sheet 300 has a configuration in which two bent parts 10*a* do not overlap with each other in a view from above. That is, two bent parts 10*a* are respectively positioned on opposite sides of multilayered heat conductive sheet 300. In other words, in the view from above, non-adhesive area 18 and two non-adhesive areas 14 are positioned between two bent parts 10*a*.

With this configuration, multilayered heat conductive sheet 300 can achieve high heat radiation property and high bendability.

<About Heat Conductive Sheet>

Fourth Exemplary Embodiment

Figure 5:
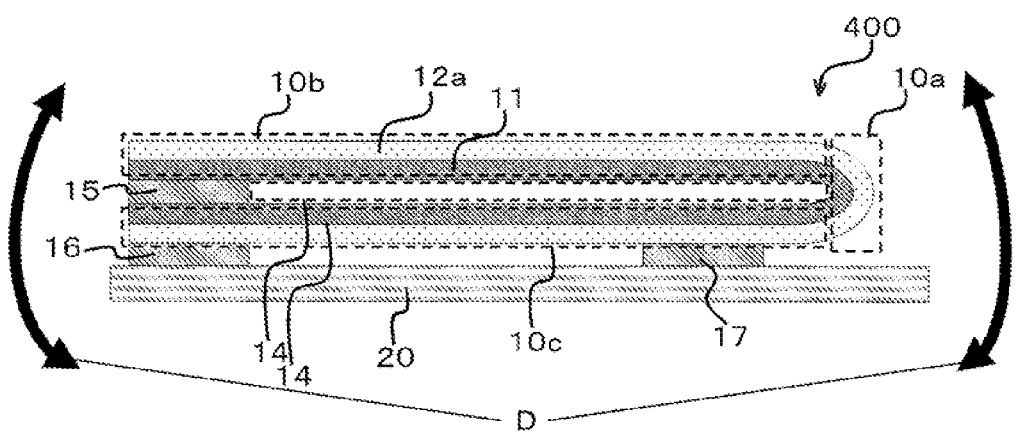
FIG. 5 is a cross-sectional view of a heat conductive sheet according to a fourth exemplary embodiment of the present disclosure.

FIG. 5 is a cross-sectional view of a heat conductive sheet according to a fourth exemplary embodiment of the present disclosure.

Heat conductive sheet 400 has a configuration in which protective film 12*b* of heat conductive sheet 100 is not provided. Heat conductive sheet 400 can also achieve high bendability.

Fifth Exemplary Embodiment

Figure 6:
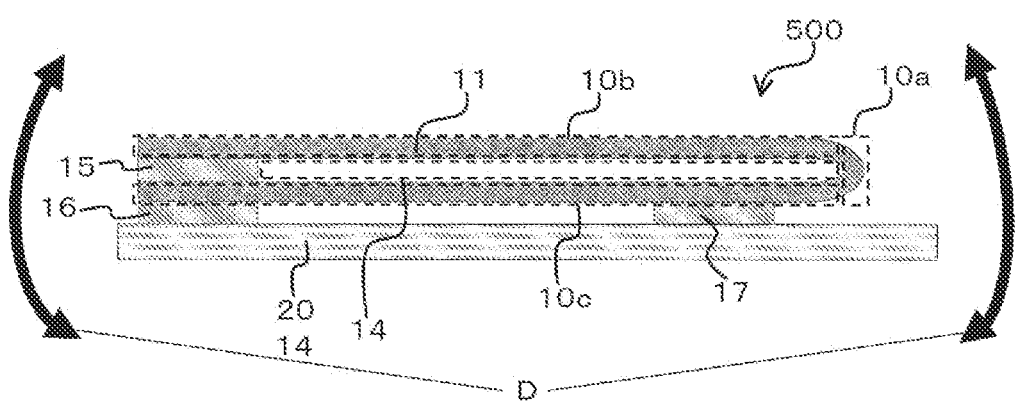
FIG. 6 is a cross-sectional view of a heat conductive sheet according to a fifth exemplary embodiment of the present disclosure.

FIG. 6 is a cross-sectional view of a heat conductive sheet according to a fifth exemplary embodiment of the present disclosure.

Heat conductive sheet 500 has a configuration in which protective film 12*a* and protective film 12*b* in heat conductive sheet 100 are not provided.

Heat conductive sheet 500 can also achieve high bendability.

Sixth Exemplary Embodiment

Figure 7:
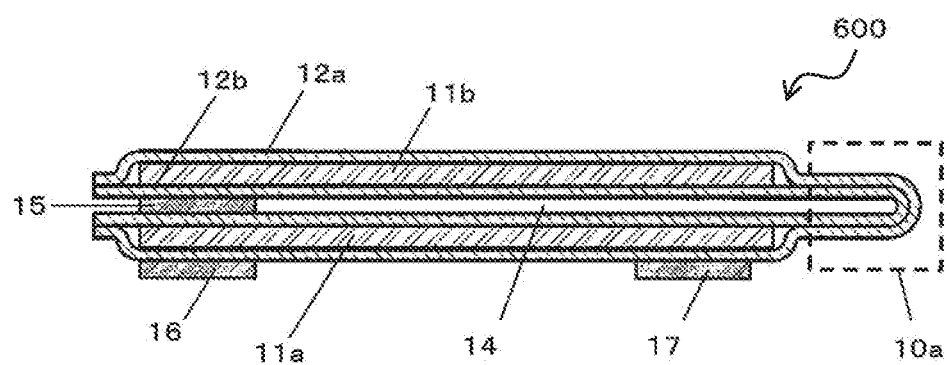
FIG. 7 is a cross-sectional view of a heat conductive sheet according to a sixth exemplary embodiment of the present disclosure.

FIG. 7 is a cross-sectional view of a heat conductive sheet according to a sixth exemplary embodiment of the present disclosure.

Heat conductive sheet 600 includes a heat radiation sheet formed by sandwiching and pasting first graphite sheet 11*a* and second graphite sheet 1*ib* by protective film 12*b* and protective film 12*a* with a predetermined space provided between first graphite sheet 11*a* and second graphite sheet 1*ib*. This heat radiation sheet is bent at a region where the protective films between first graphite sheet 11*a* and second graphite sheet 1*ib* are adhered to each other, such that first graphite sheet 11*a* and second graphite sheet 1*ib* overlap with each other. This bent portion is referred to as bent part 10*a*. The protective films are adhered to each other by adhesive layer 15 at a region on an opposite side to bent part 10*a* of first graphite sheet 11*a* and second graphite sheet 1*ib*. As this adhesive layer 15, for example, a double-sided tape having acrylic-based adhesive material on both surfaces of a PET film can be used. This adhesive layer 15 is not provided on an entire surface of the protective films, and first non-adhesive area 14 where the protective films are not adhered to each other is provided between adhesive layer 15 and bent part 10*a*.

Heat conductive sheet 600 includes, in a view from above, adhesive layer 16 overlapping adhesive layer 15, and adhesive layer 17 on the identical plane with adhesive layer 16. For example, adhesive layer 16 is adhered to a heat generation component, and adhesive layer 17 is adhered to a heat radiation part. A configuration may be adopted in which the heat generation component and heat radiation part are provided on separate substrates or housings, and each of the substrates are bendable. In this case, when a sheet whose entire surface is laminated and adhered is bent, because a radius of bending differs between an inside and an outside of the sheet, large stress is generated within the sheet to possibly cause destruction of the sheet.

On the other hand, by taking the configuration of the present exemplary embodiment in which a region of first non-adhesive area 14 is bent, bent part 10*a* moves so as to alleviate the stress, and the heat conductive sheet having high bendability can be obtained.

Here, the view from above refers to a view seen from a direction above second graphite sheet 1*ib* and perpendicular to a principal surface of the second graphite sheet. For example, in FIG. 8, when viewed from second graphite sheet 1*ib*, a side opposite to first graphite sheet 11*a* is the view from above.

Seventh Exemplary Embodiment

Figure 8:
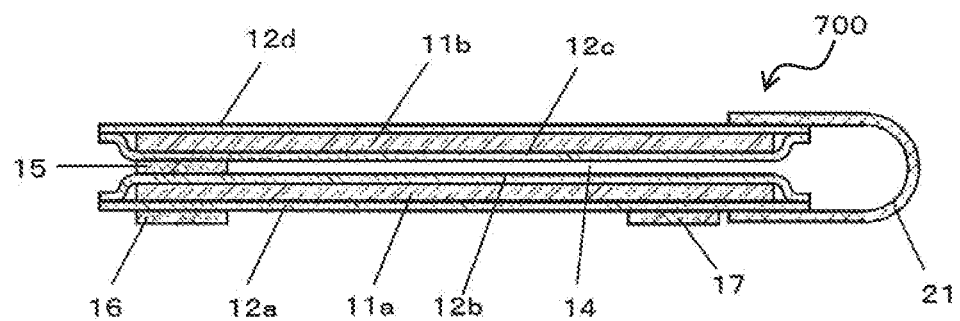
FIG. 8 is a cross-sectional view of a heat conductive sheet according to a seventh exemplary embodiment of the present disclosure.
Figure 9:
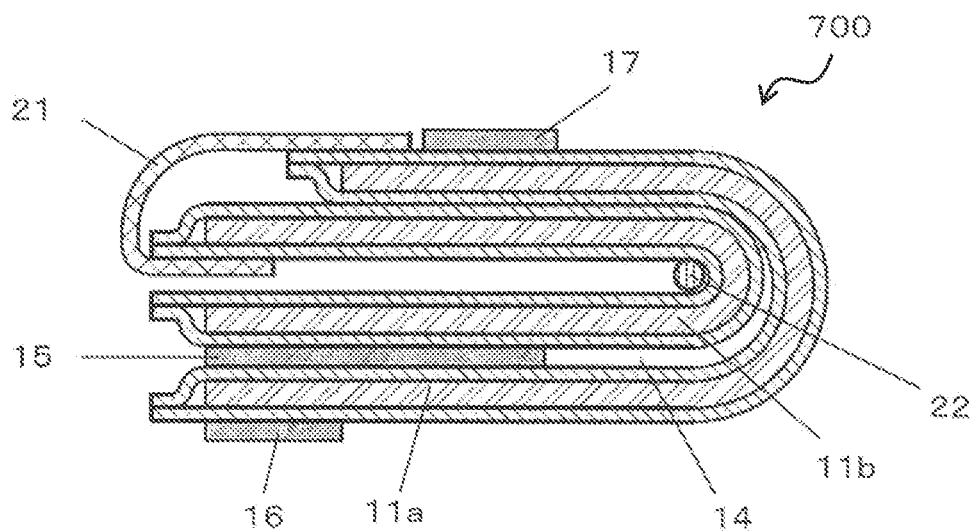
FIG. 9 is a cross-sectional view of the heat conductive sheet formed by bending the heat conductive sheet of FIG. 8.

FIG. 8 is a cross-sectional view of a heat conductive sheet according to a seventh exemplary embodiment, and FIG. 9 is a cross-sectional view of the heat conductive sheet showing a state in which the heat conductive sheet of FIG. 8 is bent.

In heat conductive sheet 700, a first heat radiation part is configured by sandwiching and pasting first graphite sheet 11*a* by protective film 12*a* and protective film 12*b*, and a second heat radiation part is configured by sandwiching and pasting second graphite sheet 1*ib* by protective film 12*c* and protective film 12*d*.

An end part of the first heat radiation part and an end part of the second heat radiation part are adhered to each other by a first adhesive layer, and another end part of the first heat radiation part and another end part of the second heat radiation part are connected by connecting member 21. As this connecting member 21, a connecting member having a larger elongation rate than the first heat radiation part and the second heat radiation part is used. Here, the elongation rate refers to a rate in which an amount of elongation of a sheet having an equal shape when pulled by a force less than or equal to a breaking limit are compared. As connecting member 21, for example, a sheet formed of polyethylene, urethane, silicone, and or the like can be used.

FIG. 9 is a cross-sectional view of heat conductive sheet 700 of FIG. 8 in a state of being bent along bending shaft 22. The sheet is bent such that bending shaft 22 abuts against a portion of first non-adhesive area 14. Because the protective films are not adhered to each other on a side of connecting member 21, connecting member 21 is deformed as shown in FIG. 9 to reduce stress applied to the heat radiation part.

Eighth Exemplary Embodiment

Figure 10:
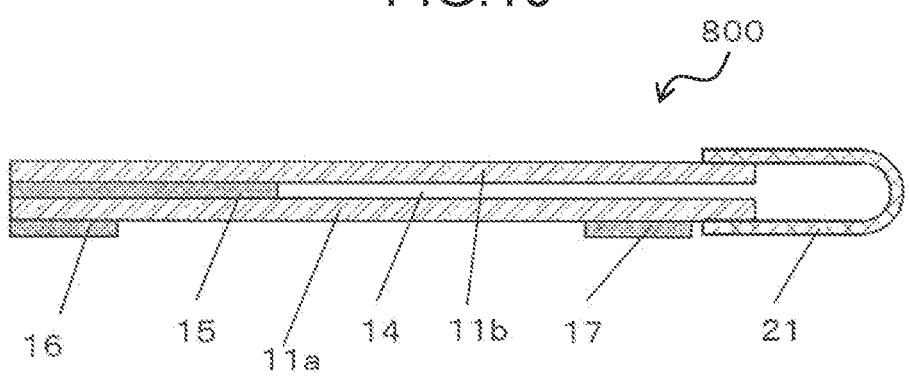
FIG. 10 is a cross-sectional view of a heat conductive sheet according to an eighth exemplary embodiment of the present disclosure.

FIG. 10 is a cross-sectional view of a heat conductive sheet according to an eighth exemplary embodiment of the present disclosure.

In the heat conductive sheet of FIG. 8, first graphite sheet 11*a* and second graphite sheet 11*b* are respectively sandwiched and pasted with the protective films, however, heat conductive sheet 800 of FIG. 10 does not use the protective films and has a configuration as follows. An end part of first graphite sheet 11*a* and an end part of second graphite sheet 11*b* are adhered to each other by first adhesive layer 15. Further, another end part of first graphite sheet 11*a* and another end part of second graphite sheet 11*b* are connected by connecting member 21, and first non-adhesive area 14 is provided between first adhesive layer 15 and connecting member 21. With this configuration, the heat conductive sheet having more excellent heat conductivity can be obtained.

Note that first adhesive layer 15 can be formed larger as in FIG. 10 as long as first adhesive layer 15 does not reach a region of bending. With this configuration, the heat conductive sheet having more excellent heat conductivity can be obtained.

A heat conductive sheet and a multilayered heat conductive sheet are useful in various electronic devices requiring high heat radiation property and high bendability.

The invention claimed is:

1. A multilayered heat conductive sheet formed by laminating a plurality of heat conductive sheets including a first heat conductive sheet and a second heat conductive sheet, wherein:

each of the plurality of heat conductive sheets comprises a heat radiation sheet, a first adhesive layer, a second adhesive layer, a third adhesive layer, a first non-adhesive area and a second non-adhesive area, the heat radiation sheet includes:
a graphite sheet, a first protective film provided on one surface side of the graphite sheet, and a second protective film provided on another surface side of the graphite sheet,
a bent part, and
a first heat radiation part and a second heat radiation part coupled to each other through the bent part, the graphite sheet, the first protective film and the second protective film are bent at the bent part such that the heat radiation sheet has a U-shape having an bent end and an open end opposite to the bent end in a cross-sectional view perpendicular to a principal surface of the first heat radiation part, and the first protective film is located inward the U-shape and the second protective film is located outward the U-shape, the first adhesive layer, by which the first heat radiation part and the second heat radiation part are adhered to each other, is disposed between the first heat radiation part and the second heat radiation part, the first non-adhesive area is arranged between the bent part and the first adhesive layer in a view from a perpendicular direction to the principal surface of the first heat radiation part, the second adhesive layer overlaps the first adhesive layer in the view from the perpendicular direction, and is positioned between the first heat radiation sheet and the second heat radiation sheet in the view from the perpendicular direction, the third adhesive layer is arranged on an identical plane with the second adhesive layer, and is positioned between a part of the first non-adhesive area and the bent part in the view from the perpendicular direction, the first heat conductive sheet and the second heat conductive sheet overlap each other in the view from the perpendicular direction, the second heat conductive sheet is adhered to the second adhesive layer and the third adhesive layer on the first heat conductive sheet, the bent end of the first heat conductive sheet faces a first direction and the bent end of the second heat conductive sheet faces a second direction opposite to the first direction, and the open end of the first heat conductive sheet faces the second direction and the open end of the second heat conductive sheet faces the first direction, where the first direction is defined as a direction from the third adhesive area to the second adhesive layer, the bent end of the first heat conductive sheet protrudes beyond the open end of the second heat conductive sheet in the view from the perpendicular direction, and the bent end of the second heat conductive sheet protrudes beyond the open end of the first heat conductive sheet in the view from the perpendicular direction, and the second non-adhesive area is positioned between the second adhesive layer and the third adhesive layer in the view from the perpendicular direction.

2. The multilayered heat conductive sheet according to claim 1, wherein the second non-adhesive area overlaps the first non-adhesive area in the view from the perpendicular direction.

3. The multilayered heat conductive sheet according to claim 1, wherein the first non-adhesive area and the second non-adhesive area are provided between the bent part of the first heat conductive sheet and the bent part of the second heat conductive sheet in the view from the perpendicular direction.

4. The multilayered heat conductive sheet according to claim 1, wherein the heat radiation sheet includes only one bent part.

* * * * *